(12) United States Patent
Wakiya et al.

(10) Patent No.: US 8,697,345 B2
(45) Date of Patent: Apr. 15, 2014

(54) PHOTORESIST STRIPPING SOLUTION AND A METHOD OF STRIPPING PHOTORESISTS USING THE SAME

(75) Inventors: Kazumasa Wakiya, Kanagawa-ken (JP); Shigeru Yokoi, Kanagawa-ken (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 351 days.

(21) Appl. No.: 12/662,151

(22) Filed: Apr. 1, 2010

(65) Prior Publication Data

US 2010/0190112 A1    Jul. 29, 2010

Related U.S. Application Data

(63) Continuation of application No. 11/516,562, filed on Sep. 7, 2006, now abandoned, which is a continuation of application No. 11/232,986, filed on Sep. 23, 2005, now abandoned, which is a continuation of application No. 10/925,978, filed on Aug. 26, 2004, now abandoned, which is a continuation of application No. 10/208,054, filed on Jul. 31, 2002, now abandoned.

(30) Foreign Application Priority Data

Dec. 27, 2001 (JP) .................. 2001-397568

(51) Int. Cl.
*G03F 7/42* (2006.01)
*G03F 7/36* (2006.01)
*G03F 7/40* (2006.01)

(52) U.S. Cl.
USPC ............ 430/329; 430/313; 430/318; 510/176

(58) Field of Classification Search
None
See application file for complete search history.

(56) References Cited

U.S. PATENT DOCUMENTS

| | | | |
|---|---|---|---|
| 5,444,023 A | 8/1995 | Homma | 437/195 |
| 5,563,119 A | 10/1996 | Ward | |
| 6,117,364 A | 9/2000 | Vorderbruggen et al. | 252/395 |
| 6,440,326 B1 * | 8/2002 | Maruyama et al. | 252/79.1 |
| 6,475,966 B1 | 11/2002 | Sahbari | |
| 6,531,436 B1 | 3/2003 | Sahbari et al. | 510/176 |
| 2001/0004633 A1 | 6/2001 | Naghshineh et al. | |
| 2002/0128164 A1 | 9/2002 | Hara et al. | 510/175 |

FOREIGN PATENT DOCUMENTS

| | | |
|---|---|---|
| EP | 1 211 563 | 6/2002 |
| JP | 01-502059 | 7/1989 |
| JP | 06-202345 | 7/1994 |
| JP | 07-28254 | 1/1995 |
| JP | 07-219241 | 8/1995 |
| JP | 08-262746 | 10/1996 |
| JP | 10-289891 | 10/1998 |
| JP | 11-084686 | 3/1999 |
| JP | 11-251214 | 9/1999 |
| JP | 2000-164597 | 6/2000 |
| JP | 2001-022096 | 1/2001 |
| WO | 01/95381 | 12/2001 |

OTHER PUBLICATIONS

Office Action issued on Jul. 18, 2012 in corresponding German Patent Application No. 10239768.6 with English translation.

* cited by examiner

*Primary Examiner* — Sin J. Lee
(74) *Attorney, Agent, or Firm* — Wenderoth, Lind & Ponack, L.L.P.

(57) ABSTRACT

A photoresist stripping solution comprising (a) a specified quaternary ammonium hydroxide, such as tetrabutylammonium hydroxide, tetrapropylammonium hydroxide, methyltributylammonium hydroxide or methyltripropylammonium hydroxide, (b) a water-soluble amine, (c) water, (d) a corrosion inhibitor and (e) a water-soluble organic solvent, the compounding ratio of component (a) to component (b) being in the range of from 1:3 to 1:10 by mass, as well as a method of stripping photoresists using the solution. The stripping solution of the invention assures effective protection of Al, Cu and other wiring metal conductors against corroding as well as efficient stripping of the photoresist film, post-ashing residues such as modified photoresist film and metal depositions. It also assures efficient stripping of Si-based residues and effective protection of the substrate (particularly the reverse side of a Si substrate) from corroding.

10 Claims, No Drawings

PHOTORESIST STRIPPING SOLUTION AND A METHOD OF STRIPPING PHOTORESISTS USING THE SAME

This is a continuation of U.S. patent application Ser. No. 11/516,562, filed Sep. 7, 2006, now abandoned, which is a continuation of U.S. patent application Ser. No. 11/232,986, filed Sep. 23, 2005, now abandoned, which is a continuation of U.S. patent application Ser. No. 10/925,978, filed Aug. 26, 2004, now abandoned, which is a continuation of Ser. No. 10/208,054, filed Jul. 31, 2002, now abandoned.

BACKGROUND OF THE INVENTION

1. Field of the Invention

This invention relates to a photoresist stripping solution and a method of stripping photoresists using the same. The invention is suitable for use in the fabrication of semiconductor devices such as ICs and LSIs, as well as liquid-crystal panel apparatus.

2. Description of Relevant Art

The fabrication of semiconductor devices such as ICs and LSIs, as well as liquid-crystal panel apparatus, comprises forming a uniform photoresist coating over conductive metallic layers, insulation layers such as an $SiO_2$ film formed on a substrate (silicon wafer) by CVD; performing selective exposure and development to form a photoresist pattern; selectively etching the substrate having the conductive metallic layers, the insulation layers formed thereon by CVD, using the photoresist pattern as a mask to thereby form a microcircuit; and then removing the unwanted photoresist layer with a stripping solution.

With the recent tendency toward highly integrated, high-density circuits, dry etching enabling fine etching with a higher density has become the major means. Also, it has been a practice to employ plasma ashing to remove the unnecessary photoresist layers remaining after etching. After these etching and ashing treatments, residues comprising modified photoresist films and other components, referred to horn-like shaped "veil", "fences" or "side-walls", remain on the bottom or side wall of patterned grooves. In addition, etching of metallic layers and ashing treatment builds up metal depositions. Such post-ashing residues or depositions should be completely stripped away so as to keep good yields in the production of semiconductors.

In particular, as the degree of integration of semiconductor devices increases and the chip size decreases, efforts are recently being made to reduce the feature size of wiring circuits while fabricating them in an increasing number of superposed layers. A problem with this approach is that wiring delay is caused by the resistance of the metal films used (wiring resistance) and wiring capacity. To deal with this problem, it has been proposed to use metals such as copper (Cu) that have smaller resistance than aluminum (Al) mainly used as a conventional wiring material, and recent models of semiconductor devices can be divided into two types, one using Al conductors (Al, Al alloy and other Al-based metal wiring) and the other using Cu conductors (Cu-based metal wiring). In addition to the need to prevent devices of these two types from corroding, it is also necessary to provide effective protection against corrosion of other metals on the devices, and further improvements are desired to achieve effective stripping away of the photoresist layer and the post-ashing residues, and to prevent metal conductors from corroding.

For critical reasons such as low etching resistance of copper, copper metal wiring is generally formed by the dual damascene process. While various methods have been proposed to implement the dual damascene process, one example comprises the following: a Cu layer is formed on a substrate; a multiple of interlevel films, such as low-dielectric films (e.g. SOG film) and insulation films (e.g. SiN film and $SiO_2$ film), are superposed on the Cu layer; a photoresist layer is provided on the topmost layer, and selectively exposed and developed to form a photoresist pattern; with this photoresist pattern used as a mask, the low-dielectric films, insulation films are etched and subjected to ashing treatment to strip away the photoresist pattern while forming via holes that connect to the Cu layer on the substrate; subsequently, another photoresist layer is formed on the topmost of the remaining superposed interlevel films and is selectively exposed and developed to form a new photoresist pattern; with this photoresist pattern used as a mask, a specified number of low-dielectric films, insulation films are etched, and subjected to ashing treatment to strip away the photoresist pattern while forming wiring grooves (trenches) that communicate with the above-described via holes; the via holes and wiring trenches are filled with Cu by plating or other method, thereby forming multiple layers of Cu wiring.

In the dual damascene process, Cu-based residues (Cu deposition) are prone to occur as the result of etching and ashing treatments that are effected to form the via holes; in addition, Si-based residues (Si deposition) originating from the low-dielectric films and insulation films are prone to occur as the result of etching and ashing treatments that are effected to form the wiring trenches, and the residues are occasionally formed as Si deposition around the opening of each trench. Unless the Cu and Si depositions are completely stripped away, problems will occur such as lower yield of semiconductor fabrication.

Needless to say, the occurrence of Si-based residues (Si deposition) originating from the low-dielectric films and insulation films is not limited to the case of using the dual damascene process; they can occur in almost all cases of forming metal wiring on the substrate having. Si-based interlevel films thereon.

Thus, in the current photolithographic technology, the photoresist stripping techniques are required to meet increasingly rigorous conditions in order to adjust for the decreasing feature size of patterns, the formation of more interlevel layers on the substrate and the changes in materials formed on the substrate surface. Of course, to ensure a good working environment, the photoresist stripping solution to be used must be not only easy to handle but also less hazardous in such terms as toxicity and explosiveness.

Under these circumstances, a variety of stripping solutions based on quaternary ammonium hydroxides and water-soluble amines have been proposed to date as candidates that meet the above-mentioned various requirements of stripping photoresists and post-ashing residues (see, for example, JP-A-1-502059, JP-A-6-202345, JP-A-7-28254, JP-A-7-219241, JP-A-8-262746, JP-A-10-289891, JP-A-11-251214, JP-A-2000-164597 and JP-A-2001-22096).

A problem with the stripping solutions proposed in those patents is that if their ability to strip the photoresist film and post-ashing residues, particularly the ability to strip Si-based residues, is enhanced to an adequate level, they are not capable of providing adequate protection against corrosion of the Si substrate, particularly its reverse side; hence, the ability to strip the Si-based residues must be compromised to some extent.

However, for successful lithography in today's practice of fabricating semiconductor devices with an ever decreasing feature size and an increasing number of interlevel films superposed on the substrate, stripping of the Si-based residues cannot be compromised and it is desired to develop a stripping solution that meets both requirements for efficient stripping of Si-based residues and effective protection of the Si substrate from corroding.

A group of stripping solutions that contain hydroxylamines have also been proposed, but the starting materials from which they are made are highly hazardous (e.g. explosive) and at the stage of purification, they are not easy to handle since they are toxic or hazardous.

SUMMARY OF THE INVENTION

The present invention has been accomplished under these circumstances and has as an object of providing a photoresist stripping solution that is suitable for use in the photolithographic technology to form today's semiconductor and liquid-crystal display devices having an ever decreasing feature size and an increasing number of interlevel films superposed on the substrate, and that can assure effective protection of Al, Cu and other wiring metal conductors against corrosion as well as efficient stripping of the photoresist film, post-ashing residues and metal depositions.

Another object of the invention is to provide a photoresist stripping solution that is particularly suitable for use in the formation of metal wiring on a substrate overlaid with Si-based interlevel films such as insulation films (e.g. $SiO_2$ film) and low-dielectric films (e.g. SOG film), and by means of which efficient stripping of Si-based residues originating from these Si-based interlevel films and effective protection of the substrate, particularly the reverse side of an Si substrate, from corroding can be accomplished in a balanced way.

The present invention provides a photoresist stripping solution comprising (a) a quaternary ammonium hydroxide of the following general formula (I):

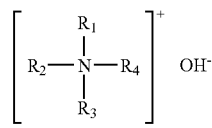
(I)

where $R_1$, $R_2$, $R_3$ and $R_4$ are each independently an alkyl group or a hydroxyalkyl group, provided that at least one of $R_1$, $R_2$, $R_3$ and $R_4$ is an alkyl or hydroxyalkyl group having at least 3 carbon atoms, (b) a water-soluble amine, (c) water, (d) a corrosion inhibitor and (e) a water-soluble organic solvent, the compounding ratio of component (a) to component (b) being in the range of from 1:3 to 1:10 by mass.

The present invention also provides a method of stripping photoresists which comprises forming a photoresist pattern on a substrate, etching the substrate using the photoresist as a mask, and thereafter stripping away the photoresist pattern from the substrate using the photoresist stripping solution as described above.

The present invention furthermore provides a method of stripping photoresists which comprises forming a photoresist pattern on a substrate, etching the substrate using the photoresist as a mask, then plasma ashing the photoresist pattern, and thereafter stripping away post-plasma ashing residues from the substrate using the photoresist stripping solution as described above.

DETAILED DESCRIPTION OF THE INVENTION

The present invention is described below in detail.
In the invention, component (a) is a quaternary ammonium hydroxide of the following general formula (I):

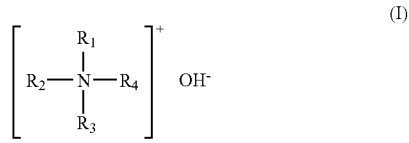
(I)

where $R_1$, $R_2$, $R_3$ and $R_4$ are each independently an alkyl group or a hydroxyalkyl group, provided that at least one of $R_1$, $R_2$, $R_3$ and $R_4$ is an alkyl or hydroxyalkyl group having at least 3 carbon atoms.

Specifically, the quaternary ammonium hydroxide represented by the general formula (I) is preferably at least one compound selected from among tetrabutylammonium hydroxide, tetrapropylammonium hydroxide, methyltributylammonium hydroxide and methyltripropylammonium hydroxide.

In the conventional photoresist stripping solutions, as quaternary ammonium, hydroxidestetramethylammonium hydroxide, tetraethylammonium hydroxide, methyltriethylammonium hydroxide and dimethyldiethylammonium hydroxide, etc. have been used. These compounds claim high performance in removing Si-based residues, however, they attack Al, Cu, Si, etc. so strongly that corrosion, damage and other defects are prone to occur. In contrast, component (a) in the present invention is not only high in its ability to remove Si-based residues but also mild in its action of attacking Al, Cu, Si, etc. Therefore, by using component (a), efficient stripping of Si-based residues and effective protection of not only the Si substrate but also wiring metals such as Al and Cu against corrosion can be achieved in a balanced way, thus providing a more desirable photoresist stripping solution. Compounds as component (a) can be used either singly or in admixture.

The stripping solution of the invention preferably contains component (a) in an amount of 1-20 mass percent, more preferably 2-10 mass percent. If the proportion of component (a) is less than 1 mass percent, the overall stripping ability tends to be insufficient; if the proportion of component (a) is more than 20 mass percent, the substrate is prone to corrode.

Water-soluble amine as component (b) include alkanolamines, such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine and triisopropanolamine; polyalkylenepolyamines, such as diethylenetriamine, triethylenetetramine, propylenediamine, N,N-diethylethylenediamine, 1,4-butanediamine, N-ethylethylenediamine, 1,2-propanediamine, 1,3-propanediamine and 1,6-hexanediamine; aliphatic amines, such as 2-ethylhexylamine, dioctylamine, tributylamine, tripropylamine, triallylamine, heptylamine and cyclohexylamine; aromatic amines, such as benzylamine and diphenylamine; and cyclic amines, such as piperazine, N-methyl-piperazine, methylpiperazine and hydroxyethylpiperazine. Among these, monoethanolamine, 2-(2-aminoethoxy)ethanol and N-methylethanolamine are preferably used from the viewpoint of preventing metal conductors from corrosion. Compounds as component (b) may be used either singly or in admixture.

Component (b) is compounded in a mass 3-10 times, preferably 4-9 times, the mass of component (a). If component (b) is compounded in a mass less than 3 times the mass of component (a), the overall stripping ability is inadequate; if component (b) is compounded in a mass more than 10 times the mass of component (a), the substrate is not adequately protected against corroding.

Compounds used as component (b) have different strengths of attack on metals (e.g. Al and Cu) and Si, so it is recommended that they be compounded in a suitably adjusted optimum amount. For instance, if strongly corrosive monoethanolamine is used as component (b), it is recommended to adjust the optimum amount to lie within the range of about 3-6 times the mass of component (a); if less corrosive 2-(2-aminoethoxy)ethanol is used as component (b), it is preferably used in an amount about 4-8 times the mass of component (a); if much less corrosive N-methylethanolamine is used as component (b), it is preferably used in an amount about 5-10 times, more preferably about 5-9 times, the mass of component (a).

Water as component (c) is incidental to the other components in the stripping solution of the invention but more of it need be added to have its amount adjusted to meet the purposes of the invention. Component (c) is preferably compounded in an amount of 10-50 mass percent, more preferably 20-45 mass percent, of the stripping solution of the invention. If the compounding amount of component (c) is less than 10 mass percent, the strippability of residues tends to decrease; if the compounding amount of component (c) exceeds 50 mass percent, the possibility for wiring metals such as Al and Cu to corrode is high.

The compounding amount of component (c) is preferably optimized according to the device forming process. Take, for example, the stripping step which is currently performed by any one of dip method, spray method or paddle method. In a process adopting the dip or spray method which features a comparatively long time of contact between the photoresist stripping solution and the substrate, component (c) is preferably compounded in an amount of about 10-30 mass percent. In a process adopting the paddle method which features a comparatively short time of contact between the photoresist stripping solution and the substrate, component (c) is preferably compounded in an amount of about 30-50 mass percent.

The corrosion inhibitor as component (d) is preferably at least one compound selected from among aromatic hydroxy compounds, benzotriazole-based compounds and mercapto group containing compounds.

The aromatic hydroxyl compounds include phenol, cresol, xylenol, pyrocatechol(=1,2-dihydroxybenzene), tert-butylcatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydroxybenzoic acid, 3,4-dihydroxybenzoic acid, 3,5-dihydroxybenzoic acid and gallic acid. Among them, pyrocatechol, pyrogallol and gallic acid, etc. are used with advantage. The aromatic hydroxyl compounds may be used either individually or in combination.

The benzotriazole-based compounds include the ones represented by the following general formula (II):

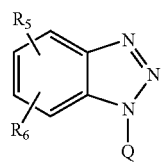

(II)

where $R_5$ and $R_6$ are each independently a hydrogen atom, a substituted or unsubstituted hydrocarbon group of 1-10 carbon atoms, a carboxyl group, an amino group, a hydroxyl group, a cyano group, a formyl group, a sulfonylalkyl group or a sulfo group; Q is a hydrogen atom, a hydroxyl group or a substituted or unsubstituted hydrocarbon group of 1-10 carbon atoms provided that said hydrocarbon group may have an amide bond or ester bond in the structure, an aryl group or the group represented by the following formula (III):

(III)

wherein $R_7$ represents an alkyl group of 1-6 carbon atoms; and $R_8$ and $R_9$ are each independently a hydrogen atom, a hydroxyl group or a hydroxyalkyl group or an alkoxyalkyl group of 1-6 carbon atoms.

In the definition of the groups Q, $R_5$ and $R_6$ as specified in the present invention, each of the hydrocarbon groups may be an aromatic hydrocarbon group or an aliphatic hydrocarbon group, may be saturated or unsaturated, and may be a linear group or a branched group. Examples of a substituted hydrocarbon group include hydroxyalkyl groups and alkoxylalkyl groups.

In the case where pure Cu is used as the metal conductor on the substrate, it is particularly preferable that Q in the above general formula (II) is a group represented by the formula (III). And in the formula (III), it is preferred that $R_8$ and $R_9$ are independently a hydroxyalkyl group or an alkoxyalkyl group of 1-6 carbon atoms.

In the general formula (II), Q preferably forms a water-soluble group and to give specific examples, a hydrogen atom, an alkyl group of 1-3 carbon atoms (i.e., methyl, ethyl, propyl or isopropyl), a hydroxyalkyl group of 1-3 carbon atoms and a hydroxyl group are particularly preferred from the viewpoint of effective protection of inorganic material layer, such as a polysilicon film, an amorphous silicon film, etc. against corrosion.

Specific examples of the benzotriazole-based compounds include benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, 1-benzotriazole-methyl carboxylate, 5-benzotriazolecarboxylic acid, 1-methoxybenzotriazole, 1-(2,2-dihydroxyethyl)benzotriazole, 1-(2,3-dihydroxypropyl)benzotriazole, and products of "IRGAMET" series marketed from Ciba Speciality Chemicals such as 2,2'-{[(4-methyl-1H-benzotriazol-1-yl)methyl]imino}bisethanol, 2,2'-{[(5-methyl-1H-benzotriazol-1-yl)methyl]imino}bisethanol, 2,2'-{[(4-methyl-1H-benzotriazol-1-yl)methyl]imino}bisethane and 2,2'-{[(4-methyl-1H-benzotriazol-1-yl)methyl]imino}bispropane. Among these compounds, it is particularly preferable to use 1-(2,3-dihydroxypropyl)benzotriazole, 2,2'-{[(4-methyl-1H-benzotriazol-1-yl)methyl]

imino}bisethanol, 2,2'-{[(5-methyl-1H-benzotriazol-1-yl) methyl]imino}bisethanol, etc. The benzotriazole compounds may be used either individually or in combination.

The mercapto group containing compound is preferably of such a structure that a hydroxyl group and/or a carboxyl group is present in either α-position or β-position on the carbon atom binding to the mercapto group. Specifically, preferred examples of such compound include 1-thioglycerol, 3-(2-aminophenylthio)-2-hydroxypropylmercaptan, 3-(2-hydroxyethylthio)-2-hydroxypropylmercaptan, 2-mercaptopropionic acid and 3-mercaptopropionic acid. Among these, 1-thioglycerol is used with particular preference. Mercapto group containing compounds may be used either singly or in admixture.

Component (d) is preferably chosen as appropriate for the fabrication process, more specifically, for the applicable device. The following three examples of the fabrication process may be mentioned:

(1) a photoresist pattern is formed on a substrate having an Al metal layer and after etching the substrate with said pattern being used as a mask, ashing or other treatment is performed to strip away the photoresist pattern, thereby forming Al metal wiring;

(2) in the dual damascene process, a multiple of Si-based interlevel layers such as low-dielectric films (e.g. SOG film) and insulation films (e.g. SiN layer and $SiO_2$ layer) are formed in superposition on a Cu layer carrying substrate, and after etching the low-dielectric films and insulation films with the photoresist pattern on the topmost layer being used as a mask, the photoresist pattern is stripped away by ashing or other treatment to form via holes connecting to the Cu layer on the substrate;

(3) in the dual damascene process, after forming via holes by the method described in (2), a specified number of low-dielectric films, insulation films, etc. are etched with a new photoresist pattern on the topmost of the remaining superposed interlevel films being used as a mask, and then ashing or other treatment is performed to strip away the photoresist pattern while forming wiring grooves (trenches) that communicate with the via holes.

Needless to say, these are not the sole examples of the fabrication process to which component (d) is applicable. Various approaches have been proposed for the dual damascene process and cases (2) and (3) are not the sole examples that can be employed.

In case (1), the residues to be stripped away are mostly Al-based ones and the metal wiring to be protected against corrosion is made of an Al (inclusive of Al alloy) conductor. In a case like this, the aromatic hydroxy compound is preferably used as component (d) particularly from the viewpoint of preventing the Al conductor from corrosion.

In case (2), the residues to be stripped are mostly Cu-based residues that form on the bottom of via holes and the wiring metals to be protected against corroding are also mostly Cu-based ones. In a case like this, the benzotriazole-based compound and the mercapto group containing compound are preferably used.

In case (3), the residues are mostly Si-based ones and the wiring metals to be protected against corroding are mostly Cu-based ones. In a case like this, the benzotriazole-based compound and the mercapto group containing compound are preferably used. From the viewpoint of efficient stripping of the Si-based residues, it is preferred to use the benzotriazole-based compound in combination with the mercapto group containing compound. Since the combination of the aromatic hydroxy compound, water and the amine is known to be capable of enhanced stripping of the Si-based residues, the aromatic hydroxy compound is also used with preference in case (3).

If two or more of the three compounds mentioned above as component (d) are used in combination, they are each preferably compounded in an amount of about 0.5-10 mass percent, more preferably about 1-4 mass percent. If the amount of each compound is less than 0.5 mass percent, Al or Cu is prone to corrode. Even if the amount of each compound exceeds 10 mass percent, there is no commensurate increase in effectiveness. The upper limit for the total content of component (d) is preferably no more than about 15 mass percent.

Water-soluble organic solvents as component (e) are not specifically restricted so long as it is miscible with water and other components employed in the invention.

Examples of such water-soluble organic solvents include sulfoxides, such as dimethyl sulfoxide; sulfones, such as dimethyl sulfone, diethyl sulfone, bis(2-hydroxyethyl)sulfone and tetramethylene sulfone; amides, such as N,N-dimethylformamide, N-methylformamide, N,N-dimethylacetamide, N-methylacetamide and N,N-diethylacetamide; lactams, such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones, such as 1,3-dimethyl-2-imidazolidinone, 1,3-diethyl-2-imidazolidinone and 1,3-diisopropyl-2-imidazolidinone; and polyhydric alcohols and derivatives thereof, such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, propylene glycol monomethyl ether, propylene glycol monoethyl ether, propylene glycol monopropyl ether and propylene glycol monobutyl ether. Among these examples, preferable ones are dimethyl sulfoxide, dimethylimidazolidinone, N-methyl-2-pyrrolidone and diethylene glycol monobutyl ether. Component (e) may be used either alone or in combination with one another.

The amount of component (e) is balance of total amounts of other components in the photoresist stripping solution of the invention.

The stripping solution of the invention may further contain, as an optional component, an acetylene alcohol/alkylene oxide adduct prepared by adding an alkylene oxide to an acetylene alcohol.

As the acetylene alcohol as described above, use may be preferably made of compounds represented by the following general formula (IV):

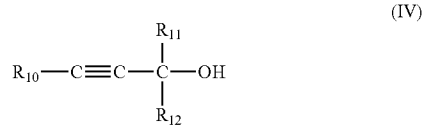

wherein $R_{10}$ is a hydrogen atom or a group represented by the following formula (V):

and $R_{11}$, $R_{12}$, $R_{13}$ and $R_{14}$ are each independently a hydrogen atom or an alkyl group having 1-6 carbon atoms.

These acetylene alcohols are commercially available under trade names of "Surfynol" and "Olfin" series (both are produced by Air Product and Chemicals Inc.). Of these commercial products, "Surfynol 104", "Surfynol 82" or mixtures thereof are most preferred for the physical properties. Use can be also made of "Olfin B", "Olfin P", "Olfin Y" etc.

As the alkylene oxide to be added to the acetylene alcohol as described above, it is preferable to use ethylene oxide, propylene oxide or a mixture thereof.

In the present invention, it is preferable to use, as the acetylene alcohol/alkylene oxide adduct, compounds represented by the following general formula (VI):

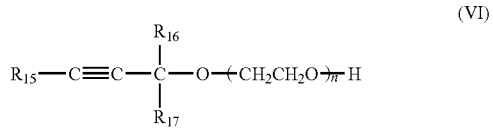

wherein $R_{15}$ is a hydrogen atom or a group represented by the following formula (VII):

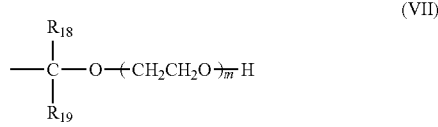

and $R_{16}$, $R_{17}$, $R_{18}$ and $R_{19}$ are each independently a hydrogen atom or an alkyl group having 1-6 carbon atoms; (n+m) is an integer of 1 to 30, which is the number of ethylene oxide molecules added. This number subtly affects the properties of the compound such as water solubility and surface tension.

The acetylene alcohol/alkylene oxide adducts per se are known as surfactants. These products are commercially available under the trade names of "Surfynol" series (products of Air Product and Chemicals Inc.) and "Acetylenol" series (products of Kawaken Fine Chemicals Co., Ltd.) and have been appropriately utilized. Among these products, it is preferred to use "Surfynol 440" (n+m=3.5), "Surfynol 465" (n+m=10), "Surfynol 485" (n+m=30), "Acetylenol EL" (n+m=4), "Acetylenol EH" (n+m=10) or mixtures thereof, in view of the changes in their physical properties such as water solubility and surface tension depending on the number of ethylene oxide molecules added. A mixture of "Acetylenol EL" with "Acetylenol EH" in a mass ratio of 2:8 to 4:6 is particularly desirable.

Use of the acetylene alcohol/alkylene oxide adduct makes it possible to improve the penetrating properties and wetting properties of the stripping solution.

When the stripping solution according to the invention contains the acetylene alcohol/alkylene oxide adduct, the amount thereof is preferably 0.05-5 mass percent, more preferably 0.1-2 mass percent. When the content exceeds the upper limit as defined above, it tends to cause foaming but the wetting properties cannot be improved any more. When the content is less than the lower limit as defined above, on the other hand, the desired improvement in the wetting properties can be scarcely established.

The photoresist stripping solution of the invention can advantageously be used with all photoresists, whether negative- or positive-working, that can be developed with aqueous alkaline solutions. Such photoresists include, but are not limited to, (i) a positive-working photoresist containing a naphthoquinonediazide compound and a novolak resin, (ii) a positive-working photoresist containing a compound that generates an acid upon exposure, a compound that decomposes with an acid to have a higher solubility in aqueous alkali solutions, and an alkali-soluble resin, (iii) a positive-working photoresist containing a compound that generates an acid upon exposure and an alkali-soluble resin having a group that decomposes with an acid to have a higher solubility in aqueous alkali solutions, and (iv) a negative-working photoresist containing a compound that generates an acid upon illumination with light, a crosslinker and an alkali-soluble resin.

According to the invention, photoresists are stripped away by one of two methods which have the following steps in common: forming a photoresist pattern by lithography on a substrate having conductive metallic layers, insulation layers and low-dielectric layers thereon, and selectively etching the layers with the photoresist pattern used as a mask to form a fine-line circuit. After these steps, the photoresist pattern is immediately stripped away (method I), or the etched photoresist pattern is subjected to plasma ashing and thereby post-ashing residues, such as the modified photoresist film (photoresist film residue) and metal deposition, are stripped away (method II).

An example of method I in which the photoresist film is stripped away immediately after etching comprises:

(I) providing a photoresist layer on a substrate;
(II) selectively exposing said photoresist layer;
(III) developing the exposed photoresist layer to provide a photoresist pattern;
(IV) etching the substrate to form a pattern using said photoresist pattern as a mask; and
(V) stripping away the photoresist pattern from the etched substrate using the photoresist stripping solution of the present invention.

An example of method II in which the modified photoresist film and metal deposition resulting from plasma ashing are stripped away after etching comprises:

(I) providing a photoresist layer on a substrate;
(II) selectively exposing said photoresist layer;
(III) developing the exposed photoresist layer to provide a photoresist pattern;
(IV) etching the substrate to form a pattern using said photoresist pattern as a mask;
(V) plasma ashing the photoresist pattern;
(VI) stripping away the post-ashing residues from the substrate using the photoresist stripping solution of the present invention.

The metal wiring can typically be aluminum (Al) based wiring or copper (Cu) based wiring. The Cu wiring as used in the invention may be either Cu alloy wiring that is mainly composed of Cu (in an amount of, say, at least about 90 mass percent) and which contains Al and other metals, or pure Cu wiring.

In the second stripping method described above, residue adhere to the substrate surface after plasma ashing, such as photoresist residue (modified photoresist film) and metal deposition that formed during etching of the metal film. These residues are contacted by the stripping solution of the invention so that they are stripped away from the substrate surface.

Plasma ashing is inherently a method for removing the photoresist pattern but it often occurs that part of the photoresist pattern remains as a modified film; the present invention is particularly effective for the purpose of completely stripping away such modified photoresist film.

In forming the photoresist layer, exposing, developing and etching treatments, any conventional means may be employed without particular limitation.

After the development step (III) or the stripping step (V) or (VI), conventional rinsing may optionally be performed using pure water, lower alcohols, etc., followed by drying.

Depending on the type of photoresist used, post-exposure bake which is usually applied to the chemically amplified photoresist may be performed. Post bake may also be performed after forming the photoresist pattern.

The photoresist is usually stripped by the dip, shower or paddle method. The stripping time is not limited to any duration as long as it is sufficient to achieve removal of the photoresist.

If the metal wiring on the substrate is made of copper (Cu), the dual damascene process may be mentioned as a preferred mode of using the photoresist stripping solution of the invention. Specifically, the method described above in the column "2. Description of the Related Art" may be mentioned as a preferred example of the dual damascene process but needless to say, that is not the sole example of the dual damascene process that can be adopted.

EXAMPLES

The following examples are provided for the purpose of further illustrating the present invention but are in no way to be taken as limiting. Unless otherwise noted, all compounding amounts are expressed by mass percent.

Examples 1-12 and Comparative Examples 1-14

A silicon wafer having an $SiO_2$ layer formed thereon was used as a substrate (Si substrate). On this substrate, an Al—Si—Cu layer, a TiN film and a P-TEOS film ($SiO_2$ film deposited using tetraethyl orthosilicate) were formed as the first, second and third layers, respectively. The topmost layer was spin-coated with a positive working photoresist (TDUR-P015 of Tokyo Ohka Kogyo Co., Ltd.), which was prebaked at 90° C. for 90 seconds to form a photoresist layer 0.7 μm thick.

The photoresist layer was exposed through a mask pattern using FPA 3000 EX3 (Canon Inc.), then subjected to post-exposure bake at 110° C. for 90 seconds and developed with an aqueous solution of 2.38 mass percent tetraammonium hydroxide (TMAH) to form a pattern of holes 350 nm in diameter. Subsequently, post bake was performed at 110° C. for 90 seconds, followed by dry etching and ashing.

The thus processed substrate was subjected to strip away post-ashing residues with one of the photoresist stripping solutions (see Tables 1 and 2) by either dipping (70° C.×30 min) or paddling (70° C.×2 min) (see Table 3 for the specific treatment adopted) and subsequently rinsed with pure water. The strippability of the Si-based residue formed around the opening of each hole, the state of corrosion of the Al wiring at the bottom of each hole, and the state of corrosion of Si in the reverse surface of the Si substrate were evaluated by examination with an SEM (scanning electron microscope). The results are shown in Table 3.

The rating criteria for the respective evaluations were as follows.

[Strippability (of Si-Based Residue)]
  A: No residue found (good strippability)
  B: Some residue left (poor strippability)
[State of Corrosion (of the Reverse Surface of Si Substrate and Al Wiring)]
  a: No corrosion found
  a': Slight corrosion
  b: Substantial corrosion

TABLE 1

| | Photoresist stripping solution (mass percent) | | | | | |
|---|---|---|---|---|---|---|
| | Component (a) | Component (b) | Component (c) | Component (d) | component (e) | Other components |
| Ex. 1 | TBAH (5) | MEA (20) | (20) | d1 + d2 (2 + 3) | NMP (50) | — |
| Ex. 2 | TBAH (2.5) | MEA (10) | (20) | d2 + d4 (5 + 2) | NMP (60.5) | — |
| Ex. 3 | TPAH (3) | MEA (15) | (15) | d1 + d3 + d4 (2 + 3 + 2) | DMF (60) | — |
| Ex. 4 | MTPAH (5) | MEA (25) | (20) | d1 + d2 + d4 (2 + 3 + 2) | DMF (43) | — |
| Ex. 5 | MTBAH (2.5) | MMA (22.5) | (15) | d4 + d5 (3 + 2) | DMI (55) | — |
| Ex. 6 | TPAH (5) | MMA (25) | (20) | d2 + d4 (3 + 2) | NMP (45) | — |
| Ex. 7 | TBAH (8) | MMA (40) | (20) | d1 + d3 (2 + 3) | NMP (27) | — |
| Ex. 8 | TPAH (5) | MEA (20) | (40) | d1 + d2 + d4 (2 + 3 + 2) | NMP (28) | — |
| Ex. 9 | TBAH (5) | MEA (20) | (40) | d1 + d3 + d4 (2 + 3 + 2) | DMI (28) | — |
| Ex. 10 | TPAH (5) | DGA (25) | (38) | d1 + d3 + d4 (2 + 3 + 2) | NMP (25) | — |
| Ex. 11 | TPAH (5) | DGA (30) | (35) | d1 + d4 (1 + 1) | NMP (28) | — |
| Ex. 12 | TPAH (5) | DGA (40) | (25) | d1 + d2 + d4 (1 + 2 + 2) | NMP (25) | — |

TABLE 2

| | Photoresist stripping solution (mass percent) | | | | | |
|---|---|---|---|---|---|---|
| | Component (a) | Component (b) | Component (c) | Component (d) | component (e) | Other components |
| Com. Ex. 1 | TBAH (5) | MEA (60) | (20) | d1 + d2 (2 + 3) | NMP (10) | — |
| Com. Ex. 2 | TBAH (10) | MEA (20) | (20) | d1 + d2 (2 + 3) | NMP (45) | — |
| Com. Ex. 3 | — | MEA (20) | (20) | d1 + d2 (2 + 3) | DMSO (50) | TMAH (5) |
| Com. Ex. 4 | — | MEA (16) | (20) | d1 + d2 + d4 (2 + 3 + 2) | NMP (53) | TEAH (4) |
| Com. Ex. 5 | — | MEA (20) | (20) | d1 + d2 + d4 (2 + 3 + 2) | NMP (48) | CO (5) |
| Com. Ex. 6 | — | DGA (25) | (15) | d1 + d2 + d4 (2 + 3 + 2) | NMP (48) | MTEAH (5) |
| Com. Ex. 7 | — | MEA (10) | (20) | d1 + d2 (2 + 5) | DMI (60.5) | DMDEAH (2.5) |
| Com. Ex. 8 | — | MEA (9) | (9.76) | — | DMI + DMSO (18 + 63) | TMAH (0.24) |
| Com. Ex. 9 | — | MEA (10) | — | d3 (3) | DMF (87) | — |
| Com. Ex. 10 | — | MEA (35) | (32) | — | DEGE (20) | TMAH (3) SRB (10) |
| Com. Ex. 11 | — | — | (8.0) | — | DEGE (90) | TMAH (2.0) |
| Com. Ex. 12 | — | MEA (40) | (28) | — | NMP (30) | TMAH (2.0) |
| Com. Ex. 13 | — | MDA (10) | (69) | — | PG (10) | TMAH (1.0) |
| Com. Ex. 14 | — | MEA (25) | (10) | — | NMP (57) | TMAH (5) |

The symbols used in Tables 1 and 2 to indicate the respective components have the following definitions, which also apply to Table 4 set forth later.

TBAH: tetrabutylammonium hydroxide
TPAH: tetrapropylammonium hydroxide
MTPAH: methyltripropylammonium hydroxide
MTBAH: methyltributylammonium hydroxide
TMAH: tetramethylammonium hydroxide
TEAR: tetraethylammonium hydroxide
CO: choline
MTPAH: methyltriethylammonium hydroxide
DMDEAH: dimethyldiethylammonium hydroxide
MEA: monoethanolamine
MMA: N-methylethanolamine
MDA: N-methyldiethanolamine
DGA: 2-(2-aminoethoxy)ethanol
d1: 2,2'-{[(4-methyl-1H-benzotriazol-1-yl)methyl]imino}bisethanol (IRGAMET 42)
d2: pyrogallol
d3: gallic acid
d4: 1-thioglycerol
d5: pyrocatechol
SRB: sorbitol
NMP: N-methyl-2-pyrrolidone
DMF: N,N-dimethylformamide
DMI: 1,3-dimethyl-2-imidazolidinone
DMSO: dimethyl sulfoxide
DEGE: diethylene glycol monoethyl ether
PG: propylene glycol

TABLE 3

| | Strippability of Si-based residue | State of corrosion of the reverse surface of Si substrate | State of corrosion of Al wiring | Condition of stripping step |
|---|---|---|---|---|
| Ex. 1 | A | a | a | 70° C.-30 min (dipping) |
| Ex. 2 | A | a | a | 70° C.-30 min (dipping) |
| Ex. 3 | A | a | a | 70° C.-30 min (dipping) |
| Ex. 4 | A | a | a | 70° C.-30 min (dipping) |
| Ex. 5 | A | a | a | 70° C.-30 min (dipping) |
| Ex. 6 | A | a | a | 70° C.-30 min (dipping) |
| Ex. 7 | A | a | a | 70° C.-30 min (dipping) |
| Ex. 8 | A | a | a | 70° C.-2 min (paddling) |
| Ex. 9 | A | a | a | 70° C.-2 min (paddling) |
| Ex. 10 | A | a | a | 70° C.-2 min (paddling) |
| Ex. 11 | A | a | a | 70° C.-2 min (paddling) |
| Ex. 12 | A | a | a | 70° C.-30 min (dipping) |
| Com. Ex. 1 | A | a | a' | 70° C.-30 min (dipping) |
| Com. Ex. 2 | A | b | a | 70° C.-30 min (dipping) |
| Com. Ex. 3 | A | b | b | 70° C.-30 min (dipping) |
| Com. Ex. 4 | A | b | b | 70° C.-30 min (dipping) |
| Com. Ex. 5 | A | b | b | 70° C.-30 min (dipping) |
| Com. Ex. 6 | A | b | b | 70° C.-30 min (dipping) |
| Com. Ex. 7 | A | b | b | 70° C.-30 min (dipping) |
| Com. Ex. 8 | B | a | b | 70° C.-30 min (dipping) |
| Com. Ex. | B | a | a | 70° C.-30 min (dipping) |

TABLE 3-continued

| | Strippability of Si-based residue | State of corrosion of the reverse surface of Si substrate | State of corrosion of Al wiring | Condition of stripping step |
|---|---|---|---|---|
| Ex. 9 Com. Ex. 10 | A | b | b | 70° C.-30 min (dipping) |
| Com. Ex. 11 | B | a | b | 70° C.-30 min (dipping) |
| Com. Ex. 12 | A | b | b | 70° C.-30 min (dipping) |
| Com. Ex. 13 | A | b | b | 70° C.-30 min (dipping) |
| Com. Ex. 14 | B | a | b | 70° C.-30 min (dipping) |

The effect of using the aromatic hydroxy compound, benzotriazole-based compound and the mercapto group containing compound as component (e) either singly or in combination was checked in the following Examples.

Examples 13-19

Substrate I

Processed substrates were prepared by repeating the procedure employed in Examples 1-12.

The processed substrates were stripped away of the post-ashing residues by dipping in photoresist stripping solutions (70° C.×30 min) consisting of 5 mass percent of tetrapropylammonium hydroxide (TPAH) as component (a), 20 mass percent of monoethanolamine (MEA) as component (b), 40 mass percent of component (c), and 30 mass percent of N-methyl-2-pyrrolidone (NMP) as component (e), plus 5 mass percent of component (d) (see Table 4 for the specific compound used), followed by rinsing with pure water. The strippability of the Al-based residue formed on the sidewall of each hole, the strippability of the Si-based residue formed around the opening of each hole, the state of corrosion of the Al wiring at the bottom of each hole, and the state of corrosion of Si in the reverse surface of the silicon wafer were evaluated by examination with an SEM (scanning electron microscope). The results are shown in Table 5. Symbols d1, d2 and d4 used in Table 4 have the same definitions as in Tables 1 and 2.

Substrate II

A silicon wafer having a $SiO_2$ layer formed thereon was used as a substrate (Si substrate). On this substrate, a Cu layer was formed in a thickness of 0.5 μm. The thus processed substrate II was stripped away of the post-ashing residues under the same conditions as for the substrate I and then rinsed with pure water. The state of corrosion of the Cu layer was evaluated by examination with an SEM (scanning electron microscope). The results are shown in Table 5.

The rating criteria for the evaluations summarized in Table 5 were as follows:

[Strippability (of Al- and Si-Based Residues)]
 ⊚: Complete stripping
 ○: tripping was almost complete but there was a residue which would not interfere with device operation; a long time was taken to remove it completely.

[State of Corrosion (of the Reverse Surface of Si Substrate, Al Wiring and Cu Layer)]
 ⊚: No corrosion found at all
 ○: corrosion was found that would interfere with device operation.
 x: Very slight corrosion These criteria correspond to subdivisions of rating A (for strippability) and rating a (for the state of corrosion) that were employed in Examples 1-12.

TABLE 4

| | Component (d) | | |
|---|---|---|---|
| | Benzotriazole-based compound | Aromatic hydroxy compound | Mercapto group containing compound |
| Ex. 13 | d1 (2) | d2 (3) | — |
| Ex. 14 | d1 (2) | — | d4 (3) |
| Ex. 15 | — | d2 (3) | d4 (2) |
| Ex. 16 | d1 (2) | d2 (1) | d4 (2) |
| Ex. 17 | d1 (5) | — | — |
| Ex. 18 | — | d2 (5) | — |
| Ex. 19 | — | — | d4 (5) |

TABLE 5

| | Substrate I | | | | Substrate II |
|---|---|---|---|---|---|
| | Strippability of Al-based residue | Strippability of Si-based residue | State of corrosion of Al wiring layer | State of corrosion of the reverse surface of Si substrate | State of corrosion of Cu wiring layer |
| Ex. 13 | ⊚ | ⊚ | ⊚ | ⊚ | ⊚ |
| Ex. 14 | ⊚ | ⊚ | ⊚ | ⊚ | ⊚ |
| Ex. 15 | ⊚ | ⊚ | ⊚ | ⊚ | ⊚ |
| Ex. 16 | ⊚ | ⊚ | ⊚ | ⊚ | ⊚ |
| Ex. 17 | ⊚ | ○ | Δ | ⊚ | ⊚ |
| Ex. 18 | ⊚ | ⊚ | ⊚ | ⊚ | ○ |
| Ex. 19 | ⊚ | ○ | ○ | ⊚ | ⊚ |

As described above in detail, according to the present invention, there is provided a photoresist stripping solution that is suitable for use in the photolithographic technology to form today's semiconductor and liquid-crystal display devices having an ever decreasing feature size and an increasing number of interlevel films superposed on the substrate and which can assure effective protection of Al, Cu and other wiring metal conductors against corrosion as well as efficient stripping of the photoresist film, post-ashing residues, and there is also provided a photoresist stripping solution that is particularly suitable for use in the formation of metal wiring on a substrate overlaid with Si-based interlevel films such as insulation films (e.g. $SiO_2$ film) and low-dielectric films (e.g. SOG film) and by means of which efficient stripping of Si deposition originating from these Si-based interlevel films and effective protection of the substrate (particularly the reverse side of an Si substrate) from corrosion can be accomplished in a balanced way.

What is claimed is:

1. A photoresist stripping solution comprising (a) a quaternary ammonium hydroxide of the following formula (I):

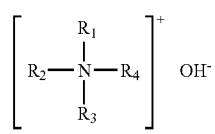

where $R_1$, $R_2$, $R_3$ and $R_4$ are each independently an alkyl group or a hydroxyalkyl group, provided that at least one of $R_1$, $R_2$, $R_3$ and $R_4$ is an alkyl or hydroxyalkyl group having at least 3 carbon atoms, (b) a water-soluble amine, (c) water, (d) a corrosion inhibitor and (e) a water-soluble organic solvent, wherein component (a) is at least one compound selected from the group consisting of tetrabutylammonium hydroxide, methyltributylammonium hydroxide and methyltripropylammonium hydroxide, wherein component (b) is at least one compound selected from the group consisting of monoethanolamine, 2-(2-aminoethoxy)ethanol and N-methylethanolamine, wherein the compounding ratio of component (a) to component (b) is in the range of from 1:3 to 1:10 by mass, and wherein the photoresist stripping solution is to be applied to a substrate having Al wiring or Cu wiring, or an Si-based interlevel film thereon.

2. The photoresist stripping solution according to claim 1, wherein component (d) is at least one compound selected from the group consisting of an aromatic hydroxy compound, a benzotriazole-based compound and a mercapto group containing compound.

3. The photoresist stripping solution according to claim 2, wherein the aromatic hydroxy compound is at least one compound selected from the group consisting of pyrocatechol, pyrogallol and gallic acid.

4. The photoresist stripping solution according to claim 2, wherein the benzotriazole-based compound is a compound represented by the following formula (II):

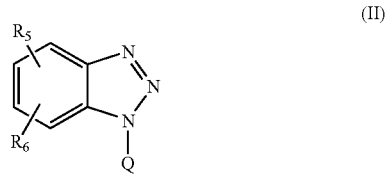

where $R_5$ and $R_6$ are each independently a hydrogen atom, a substituted or unsubstituted $C_1$-$C_{10}$ hydrocarbon group, a carboxyl group, an amino group, a hydroxy group, a cyano group, a formyl group, a sulfonylalkyl group or a sulfo group; Q is a hydrogen atom, a hydroxy group, a substituted or unsubstituted $C_1$-$C_{10}$ hydrocarbon group, provided that it may have an amido bond or an ester bond in the structure, an aryl group or a group represented by the following formula (III)

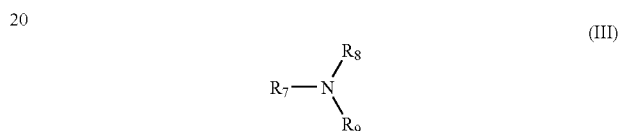

where $R_7$ is a $C_1$-$C_6$ alkyl group; $R_8$ and $R_9$ are each independently a hydrogen atom, a hydroxy group or a $C_1$-$C_6$ hydroxyalkyl or alkoxyalkyl group.

5. The photoresist stripping solution according to claim 2, wherein the benzotriazole-based compound is at least one compound selected from the group consisting of 1-(2,3-dihydroxypropyl)-benzotriazole, 2,2'-{[(4-methyl-1H-benzotriazol-1-yl)methyl]imino}bisethanol and 2,2'-{[(5-methyl-1H-benzotriazol-1-yl)methyl]imino}bisethanol.

6. The photoresist stripping solution according to claim 2, wherein the mercapto group containing compound is 1-thioglycerol.

7. A method of stripping photoresists comprising forming a photoresist pattern on a substrate, etching the substrate using said photoresist pattern as a mask, and thereafter stripping away the photoresist pattern from the substrate using the photoresist stripping solution according to claim 1, wherein the substrate has Al wiring or Cu wiring, or an Si-based interlevel film thereon.

8. The method of stripping photoresists according to claim 7, wherein the substrate is an Si substrate.

9. A method of stripping photoresists comprising forming a photoresist pattern on a substrate, etching the substrate using said photoresist pattern as a mask, then plasma ashing the photoresist pattern, and thereafter stripping away post-plasma ashing residues from the substrate using the photoresist stripping solution according to claim 1, wherein the substrate has Al wiring or Cu wiring, or an Si-based interlevel film thereon.

10. The method of stripping photoresists according to claim 9, wherein the substrate is an Si substrate.

* * * * *